Sept. 16, 1969 J. E. MURRAY ET AL 3,467,852

HIGH SPEED CONTROLLED SWITCHING CIRCUIT

Filed Jan. 26, 1967

INVENTORS
James E. Murray
Robert G. Klimo

BY Hill, Sherman, Meroni, Gross & Simpson
ATTORNEYS 3,467,852
HIGH SPEED CONTROLLED SWITCHING CIRCUIT James E. Murray, University Heights, and Robert G. Klimo, Parma, Ohio, assignors to TRW Inc., Cleveland, Ohio, a corporation of Ohio Filed Jan. 26, 1967, Ser. No. 611,972
Int. Cl. H02m 7/44, 7/68
U.S. Cl. 321—45 9 Claims

ABSTRACT OF THE DISCLOSURE

A high speed electronic switching network having a first circuit for connecting current through a load in a first directional sense and a second circuit for conducting current through the load in a second directional sense, the first and second circuits each having an electronic switch disposed in series therein for controlling the flow of current through the respective circuits and each electronic switching device having a diode or similar electronic switch connected across the input terminals thereof to compensate for the turn off switching lag of the electronic switch in the opposing circuit. A high speed rapid transition input signal is applied to the circuit and tends to forward bias one of the electronic switches and substantially simultaneously reverse bias the other electronic switch. To avoid both switches being turned on at the same time, the diodes or similar electronic devices are connected to the input terminals of each of the electronic switches to produce a time delay in the forward biasing of the respective switch.

BACKGROUND OF THE INVENTION

Field of the invention.—The field of art to which this invention pertains is a high speed electronic switching network where it is desirable to reverse the direction of current in a load rapidly and where it is desirable to avoid short circuiting the load due to inherent time delays in the power switching circuit.

SUMMARY

An important feature of this invention is the provision for a power switching circuit having at least two electronic switching devices wherein the turn "on" time of one of the switching devices is gauged to substantially coincide with the turn "off" time of the other switching device.

Another feature of the invention is the provision for a power circuit having at least two electronic switching devices connected in series with a load with each switching device being connected to conduct current through the load in opposite directional senses and wherein means are provided to assure that both electronic switches are not conducting at the same time interval.

An object of the invention is the provision of a power switching circuit having at least two electronic switching devices for switching current through a load in opposite directional senses and having third and fourth electronic switching devices connected at the input terminals of the two electronic switches to assure that both of said switches are not maintained in a conducting state simultaneously.

Another object of this invention is to provide a transistor switching circuit for switching AC power to a load wherein a diode is connected across the input terminals of each of the transistors and wherein the connection of the diode is such that the diode short circuits the input terminals of the transistor when the transistor is in a reverse biased state and wherein forward biasing of a transistor requires prior reverse biasing of the associated diode.

A further object of the invention is to provide a high speed switching circuit having input signal means with rapid polarity transitions and wherein a power switching circuit is provided to switch a power source through a load in response to the rapid polarity transitions of the input signal without generating shoot through or overlapping of the conducting time intervals of the negative and positive portions of the input signal.

Other and further objects of this invention will be apparent to those skilled in this art from the following detailed description and the annexed sheets of drawings which show several embodiments of the invention.

DESCRIPTION OF THE PREFERRED EMBODIMENTS

Figure 1:
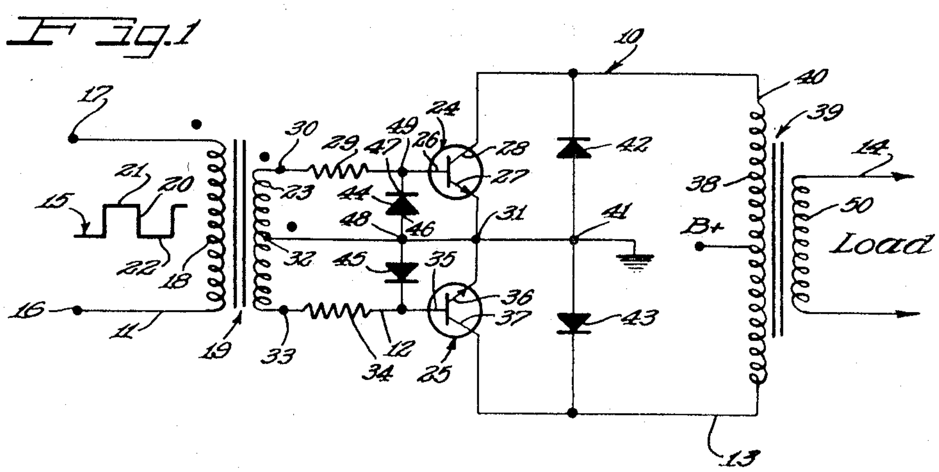
FIGURE 1 is a schematic of an electronic high speed switching circuit in accordance with the present invention.

The high speed switching circuit 10 of FIGURE 1 has an input circuit 11, a switching control circuit 12 and a power circuit 13. The input circuit 11 generates a switching signal which triggers the operation of the switching circuit 12, and the switching circuit 12 controls the flow of AC power through the power circuit 13 to a load circuit 14.

Referring to the circuit 10 in greater detail, an input signal 15 is applied to the input terminals 16 and 17 of the input circuit 11 and, accordingly, is impressed across a primary winding 18 of a transformer 19. The input signal 15 is a rectangular waveform and has rapid transitions such as the transition 20 between opposite polarities such as the polarities 21 and 22.

Essentially, the circuit or network 10 is a conversion circuit for converting a low level switching signal such as the signal 15 into a similarly formed power signal at the output of the network or at the load circuit 14. However, to generate a similarly formed rapid switching signal at the output of the network, switching means must be provided to turn "on" and "off" rapidly and accurately. Furthermore, two switches must be provided, one to switch positive current through the load and the other to switch negative current through the load. In addition, the operation of the switches must be controlled in such a manner as to assure that when the positive operating switch is turned "on" that the negative operating switch is maintained "off." Simultaneous operation of the two switches is undesirable and can result in short circuiting of the load transformer.

The input transformer 19 has a secondary winding 23 for receiving the rectangular AC signal 15 from the primary winding 18 and for properly orientating the received signal to trigger the operation of two power switches 24 and 25.

The power switches 24 and 25 are transistors which are connected to the secondary winding 23 so as to be alternately "on" or "off" depending upon the polarity of the input control signal.

The transistor 24, for instance, has a base terminal 26, an emitter 27 and a collector 28. The base terminal 26 is connected through a resistor 29 to a first terminal 30 of the secondary winding 23. The emitter 27 of the transistor 24 is connected through a junction point 31 to a center tap 32 of the secondary winding 23. Since the transistor 24 is of the NPN type, it is apparent that a positive going signal at the terminal 30 of the secondary winding 23 will cause the transistor 24 to be placed in a conducting state. However, a positive going signal at the terminal 30 of the secondary winding 32 will generate a negative going signal at the terminal 33 of the secondary winding 23.

The negative going signal as developed at the terminal 33 of the secondary winding 23 is applied through a resistor 34 to a base 35 of the transistor 25. The emitter 36 of the transistor 25 is connected to the junction point 31 and hence to the emitter 27 of the transistor 24. The transistor 25 also has a collector terminal 37 connected in a well understood manner in the power circuit 13.

It is apparent, therefore, to those skilled in the art that the negative going signal at the terminal 33 causes the transistor 25 to be placed in a non-conducting state which means that the required condition is satisfied, namely that one transistor be in a conducting state and the other transistor be in a non-conducting state. It will also be understood that the positive going and negative going signals as developed at the terminals 30 and 33 are positive going and negative going respectively with regard to the center tap of the transformer 32 which is connected to the emitters of the respective transistors 24 and 25.

Assuming that a positive voltage has been established at the base 26 of the transistor 24, and simultaneously a negative voltage has been established at the base 35 of the transistor 25, then the transistor 24 will be conducting and the transistor 25 will be non-conducting. This means that current will flow from the B+ terminal through the primary winding 38 of a power transformer 39 which is connected in the power circuit 13. This current will flow from a terminal 40 of the primary winding 38 to the collector 28 of the transistor 24, through the emitter 27 of the transistor 24 and to ground at a junction point 41.

When a positive going signal is applied to the terminal 33 of the secondary winding 23, and a simultaneous negative signal is applied to the terminal 30 of the secondary winding 23, the transistor 25 will be placed in a conducting state, and the transistor 24 will be placed in a non-conducting state. This means that current will then flow from the B+ terminal through the primary winding 38 of the transformer 39 to the collector 37 of the transistor 25, through the emitter 36 of that transistor and to the ground junction point 41. Accordingly, by alternately switching the input signal from a positive going to a negative going signal at the respective transistors, a flow of current is directed through the primary winding 38 in the power circuit 13 with substantially the same configuration as the rectangular input signal. Since one of the transistors is always reverse biased to allow the conducting of the other transistor, diodes 42 and 43 are connected across the collector and emitter terminals of the transistors 24 and 25 respectively to prevent the application of an excessive reverse bias to those transistors.

Explanation as to the operation of the circuit 10 of FIGURE 1 to this point has been limited to the operation of the circuit at times after a given polarity has been decidedly established for a sufficient period of time at the terminals 30 and 33 of the secondary winding 23. However, during the transition interval such as is illustrated by the vertical line 20 on the diagrammatic view of the input signal 15, an interval may exist when both the transistors 24 and 25 would tend to remain in a conducting state simultaneously. This is due to the inherent time delay of the transistors in switching from a conducting to a non-conducting state. Essentially, the transistors 24 and 25 will switch to a conducting state considerably more rapidly than they will switch from a conducting state. This means that the same signal that tends to turn one transistor "on" will turn that transistor "on" prior to the negative portion of that signal will be able to turn the other transistor "off." According, the turn "off" time delay of the transistors develops a shoot-through time interval during which both transistors may be in a conducting state. The result is that the series connected transistors of FIGURE 1 short circuit the primary 38 of the transformer 39 resulting in large currents in the transformer and in the transistors.

To avoid the condition wherein both the transistors 24 and 25 are held in a conducting state, the circuit of FIGURE 1 incorporates a pair of diodes 44 and 45 which also have an inherent time delay in switching from a conducting to a non-conducting state. These diodes are connected to the base and emitter terminals of the respective transistors in such a way as to precisely compensate for the time delay inherent in the transistors.

In particular, the diode 44 is connected from the emitter 27 to the base 26 of the transistor 24 such that the anode 46 of the diode 44 is connected to the emitter 27 of the transistor 24, and the cathode 47 of the diode 44 is connected to the base 26 of the transistor 24. When the transistor 24 is reverse biased due to the presence of a negative signal at the terminal 30 and at th base 26, the diode 44 is placed in a conducting state due to the presence of a potential drop from the circuit junction point 48 to the circuit junction point 49. At this time, the transistor 25 will be conducting, and the transistor 24 will be non-conducting.

When the input voltage switches from a negative going signal at the terminal 30 to a positive going signal thereat, the terminal 33 will be negative going, and the transistor 25 will be in the process of turning "off." This process of turning "off," however, requires several microseconds longer than is required to turn the transistor 24 from an "off" to an "on" condition. Accordingly, it would be expected that the transistor 24 would be turned "on" prior to the turning "off" of the transistor 25. However, due to the connection of the diode 44, the transistor 24 cannot be biased into an "on" condition until the diode 44 is biased into an "off" condition. Accordingly, the turning "on" of the transistor 24 is delayed by the amount of time required to turn "off" the diode 44. Therefore, if the turn "off" time of the diode 44 is made to substantially equal the turn "off" time of the transistor 25, the turn "on" time on the transistor 24 can substantially coincide with the turn "off" time of the transistor 25 which is, of course, the desired condition.

The diode 45 likewise has an anode and a cathode which are connected between the emitter and base of the transistor 25 as shown in FIGURE 1, and this diode performs a similar function to the diode 44 during the opposite half of the input cycle. Therefore, the turn "on" time of each transistor is delayed by an interval which substantially coincides with the turn "off" delay of the opposite transistor. In this way, both of the transistors 24 and 25 are maintained in opposite states at all times, and the primary winding 38 of the transformer 39 is not in danger of being short circuited due to the difference in the time turn "on" intervals of the respective transistors. In this way, the secondary winding 50 of the transistor 39 receives an uninterrupted steady AC signal at the proper power level, and does not receive current peaks which would be generated by an overlapping conducting interval for the transistors 24 and 25.

Figure 3:
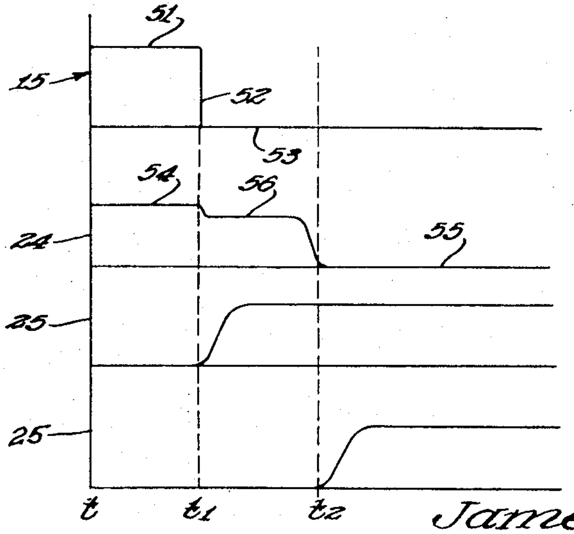
FIGURE 3 is a diagrammatic illustration of the conduction periods of the respective power transistors in the circuits of FIGURES 1 and 2.

The functioning of the diodes 44 and 45 and their effects on the operation of the transistors 24 and 25 can best be seen from a study of the diagrammatic illustration in FIGURE 3. In FIGURE 3, the trailing end portion 51 of a positive going time interval of the input wave signal 15 is shown with the time $t_0$ indicating a substantial interval after the initiation of the positive going pulse, the trailing edge portion of which is indicated by the reference numeral 51. The time $t_1$ illustrates the time at which the positive going pulse is switched along the transition 52 to a negative going signal at 53. When this occurs, the transistor 54 begins to switch from a conducting state at 54 to a non-conducting state at 55. However, this switching requires a time delay of $t_2-t_1$ illustrated by the lower level conduction period 56.

However, the switching of the signal 15 during the transition 52 will cause the transistor 25 to be conducting substantially at $t_1$, which means that during the time interval between $t_1$ and $t_2$, both the transistors 24 and 25 are conducting. However, due to the positioning of the diodes 44 and 45 as shown in FIGURE 1, the transistor 25 is delayed in turning from a non-conducting to a conducting state, and the transistor 25 now turns on at time $t_2$ rather than time $t_1$, $t_2$ substantially coinciding with the turn "off" time of the transistor 24.

Figure 2:
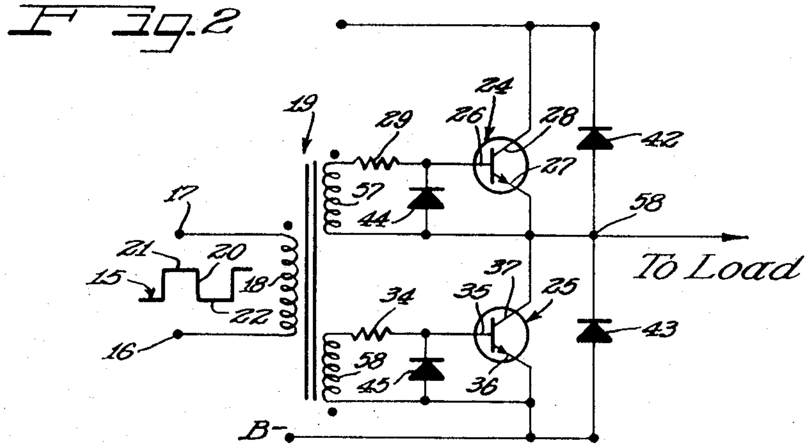
FIGURE 2 is a schematic of an alternate convenient embodiment of the present invention.

A further embodiment of the circuit of FIGURE 1 is shown in FIGURE 2. In that embodiment the input circuit is substantially identical, and reference numerals have been carried from FIGURE 1 to FIGURE 2.

However, in FIGURE 2, the secondary of the transformer 19 is split into two separate secondary windings 57 and 58. Nevertheless, the secondary windings 57 and 58 are wound in such a direction with respect to the primary 18, such that the same signal at the primary 18 yields a positive going signal to the base 26 of the transistor 24 and a negative going signal to the base 35 of the transistor 25. It will be noted that reference numerals have also been carried from FIGURE 1 to FIGURE 2 with regard to the transistors 24 and 25 as well as the diodes 44 and 45 and the further diodes 42 and 43 as well as other elements which have a similar function in the circuit of FIGURE 2 as in the circuit of FIGURE 1. Essentially, the load of the circuit in FIGURE 2 is connected to a center terminal 58 such that the conduction of the transistor 24 conducts power from the B+ terminal through the transistor 24 to the load via the junction 58, while conduction of the transistor 25 conducts power in a negative direction from the B− terminal through the transistor 25 to the load via the junction point 58. Accordingly, an AC signal is developed at the load in response to the switching of the input signal 15. To assure that the AC signal at the load is continuous and to assure that one of the transistors does not short circuit the load due to the conduction of both transistors simultaneously, the diodes 44 and 45 are connected between the emitters and the collectors of the respective transistors as shown in FIGURE 2 and function substantially identical with the corresponding elements in the circuit of FIGURE 1. The circuit is of slightly different configuration in FIGURE 2 and is illustrated to show merely that many circuit configurations are possible and that the subject of this invention is not limited to one or more embodiments, these being shown for illustrative purposes only.

Accordingly, it will be understood that various modifications and combinations of the features of this invention may be accomplished by those versed in the art, but we desire to claim all such modifications and combinations as properly come within the spirit and scope of our invention.

We claim as our invention:

1. In a high speed electronic switching network for delivering AC power to a load, a first circuit having a first electronic switch connected in series therein, said first circuit being connected to the load to deliver current therethrough in a first directional sense when said first electronic switch is in a conducting state, a second circuit having a second electronic switch connected in series therein, said second circuit being connected to the load to deliver current therethrough in a second directional sense when said second electronic switch is in a conducting state, input signal means connected to said first and second circuits and tending to bias each of said first and second electronic switches into conducting and nonconducting states respectively, said first electronic switch having an inherent time lag in switching from a conducting to a non-conducting state, a third electronic switch connected to the input signal means and to the first electronic switch and having an inherent switching time delay, said third electronic switch being periodically switched between conducting and non-conducting states in response to said input signal means and generating thereby a signal for switching said first electronic device to a conducting state, whereby the time delay of said third electronic switch is incorporated into the switching time of said first electronic switch.

2. A high speed switching network comprising:

a pair of series connected electronic switching devices coupled to deliver AC power to a load, each of said series connected switching devices having an inherent delay in switching from a conducting to a non-conducting state, signal means for alternately biasing one of said switching devices into a conducting state and simultaneously biasing the other of said switching devices into a non-conducting state, a third electronic switching device connected to one of the pair of series connected switching devices so as to prevent the application of a conducting bias to said one switching device for the duration of the turn "off" delay inherent in the switching action of said third electronic switching device, and said turn "off" delay of said third electronic switching device being so chosen as to substantially compensate for the turn "off" delay inherent in said other of the pair of series connected switching devices, whereby said one of the series connected switching devices is delayed from switching to a conducting state until the other of said series connected switching devices is switched into a non-conducting state.

3. A high speed switching device in accordance with claim 2 wherein said third electronic switching device comprises a diode connected across the input terminals of said one electronic switching device with such polarity as to short circuit the terminals of said one switching device during the application of an "off" signal thereto and so as to be reverse biased during the application of an "on" signal thereto, whereby said diode must be switched from a short circuit to a reverse biased state prior to the switching of said one electronic switching device from a non-conducting to a conducting state.

4. A high speed switching device in accordance with claim 3 wherein said one electronic switching device comprises a transistor and wherein said diode is coupled between the base and one other terminal of said transistor in such a manner as to short circuit the emitter to base when an "off" signal is applied to said transistor.

5. A high speed switching device comprising:

a load for receiving an AC current therethrough, first and second transistors connected in series with the load, a unidirectional conduction element connected in parallel with the emitter to collector terminals of each of said transistors, said unidirectional conduction elements being connected to the terminals of the associated transistors to short circuit said transistors during the application of a reverse biasing signal thereto, input signal means coupled to the bases of said transistors and generating a signal tending to forward bias one of said transistors and simultaneously reverse bias the other of said transistors, and a diode coupled across the input terminals of each of said transistors in such a manner as to be forward biased by said input signal means when said associated transistor is reverse biased by said input signal means.

6. A high speed switching device in accordance with claim 5 where said diode has an inherent cut-off time delay which is substantially equal to the cut-off time delay of said transistors.

7. A high speed switching device in accordance with claim 6 wherein said input signal means comprises an AC signal means for developing a substantially rectangular waveshape, said rectangular waveshape having rapid positive to negative transitions.

8. A high speed switching device comprising:
a load for receiving AC power from a source,
first and second transistors connected in series with the load and being connected to conduct in opposite directional senses,
input signal means for forward biasing one of said transistors and substantially simultaneously reverse biasing the other of said transistors,
each of said transistors having a diode connected from the emitter to collector thereof so as to short circuit the respective transistors when a reverse biasing signal is applied thereto,
each of said transistors having a further diode connected between the base and one other terminal thereof to provide a time delay in the forward biasing of one transistor substantially equal to the turn "off" time of the other transistor.

9. A high speed switching device comprising:
a load for receiving AC power from a source,
first and second transistors connected in parallel with the load and being connected to conduct through the load in opposite directional senses,
input signal means for forward biasing one of said transistors and substantially simultaneously reverse biasing the other of said transistors,
each of said transistors having a diode coupled across the input terminals thereof to provide a time delay in the forward biasing of one of said first and second transistors during the turn "off" delay of the other of said first and second transistors.

References Cited

UNITED STATES PATENTS

| | | | |
|---|---|---|---|
| 3,350,661 | 10/1967 | Bloom et al. | 331—113.1 |
| 2,809,303 | 10/1957 | Collins | 307—88 |
| 3,119,058 | 1/1964 | Genuit | 321—45 |
| 3,219,906 | 11/1965 | Keller et al. | 321—45 XR |
| 3,248,640 | 4/1966 | Wellford | 321—45 |
| 3,265,953 | 8/1966 | Wellford | 321—45 |
| 3,351,840 | 11/1967 | Yearley | 321—45 |
| 3,361,952 | 1/1968 | Bishop | 321—45 |

JOHN F. COUCH, Primary Examiner
W. M. SHOOP, Jr., Assistant Examiner

U.S. Cl. X.R.

331—113